United States Patent
Schönleber et al.

[11] Patent Number: 6,164,300
[45] Date of Patent: Dec. 26, 2000

[54] SUBSTATE-TREATING DEVICE

[75] Inventors: Dietmar Schönleber, Römerstein; Aurelia Fingerholz, Kirchentellinsfurt, both of Germany

[73] Assignee: Steag MicroTech GmbH

[21] Appl. No.: 09/297,426

[22] PCT Filed: Sep. 16, 1997

[86] PCT No.: PCT/EP97/05054

§ 371 Date: Apr. 28, 1999

§ 102(e) Date: Apr. 28, 1999

[87] PCT Pub. No.: WO98/19328

PCT Pub. Date: May 7, 1998

[30] Foreign Application Priority Data

Sep. 28, 1996 [DE] Germany ............ 196 44 779

[51] Int. Cl.⁷ .................................................... B08B 3/10
[52] U.S. Cl. ................................. 134/135; 134/902
[58] Field of Search ..................... 134/61, 135, 902

[56] References Cited

U.S. PATENT DOCUMENTS

| | | | |
|---|---|---|---|
| 4,714,086 | 12/1987 | Kishida et al. | 134/135 X |
| 5,261,431 | 11/1993 | Ueno et al. | |
| 5,370,142 | 12/1994 | Nishi et al. | 134/61 |
| 5,475,892 | 12/1995 | McGuire. | |
| 6,045,624 | 4/2000 | Kamikawa et al. | 134/61 X |

FOREIGN PATENT DOCUMENTS

| | | |
|---|---|---|
| 0 651 438 | 5/1995 | European Pat. Off. |
| 44 13 077 | 10/1995 | Germany. |
| 195 46 990 | 7/1996 | Germany. |
| 195 37 879 | 4/1997 | Germany. |
| 196 16 402 | 11/1997 | Germany. |
| 196 37 875 | 11/1997 | Germany. |
| 60-229339 | 11/1985 | Japan. |
| 1-312829 | 12/1989 | Japan. |
| 4-317330 | 9/1992 | Japan. |
| 6-181196 | 6/1994 | Japan. |
| 7-249604 | 9/1995 | Japan. |
| 08045883 | 2/1996 | Japan. |

*Primary Examiner*—Philip R. Coe
*Attorney, Agent, or Firm*—Robert W. Becker & Associates

[57] ABSTRACT

A device for the treatment of substrates has a container filled with a treatment fluid and at least one receiving device for lifting substrates or at least one substrate carrier out of the treatment fluid. The receiving device has a fluid suction device with suction openings and the suction openings are connected to a vacuum source. The suction openings are provided for removal of residual fluid from the substrates or the at least one substrate carrier after lifting of the substrates or the substrate carrier from the fluid. The suction openings are arranged in the vicinity of lower areas of the substrates or the substrate carrier, wherein the lower areas are located adjacent to the receiving device.

13 Claims, 2 Drawing Sheets

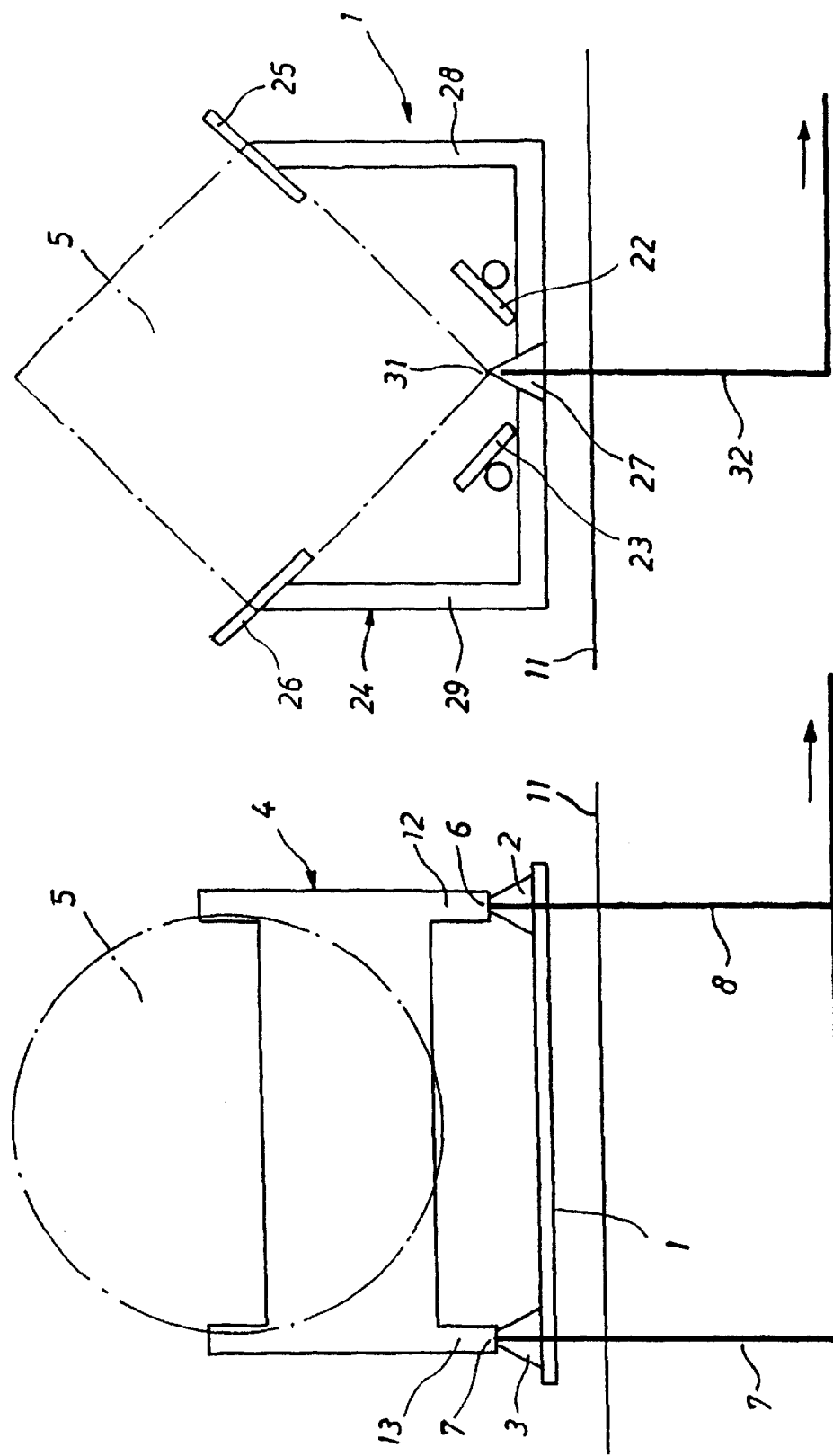

SUBSTATE-TREATING DEVICE

BACKGROUND OF THE INVENTION

The invention concerns a device for the treatment of substrates comprising a container filled with a treatment fluid, wherein at least one receiving device is provided for the substrates or at least one substrate carrier.

Devices of the aforementioned kind are known from DE 44 13 077 A1 and DE 195 46 990 A1 of the applicant of this present patent application and are also described in the German patent applications DE 195 37 879.2, DE 196 15 969.5, DE 196 16 402.8, DE 196 37 875.3 or DE 196 40 848.2 of the same applicant, which have not been published as of the filing date of this application. These devices kind have been successfully used in practice for the treatment of substrates, in particular semiconductor wafers, masks, CDs, CD-ROMs, other storage devices, for example, hard drives, etc., and for LED display panels. In particular, such devices have been used for the treatment of substrates with rinsing fluid and subsequent drying of the substrates. For more efficient and faster drying of the substrates, the so-called Marangoni method is utilized also in this context, wherein a gas, for instance, a mixture of isopropyl alcohol and nitrogen, that minimizes the surface tension of the treatment fluid is applied to the substrates as they are removed from the treatment and/or rinsing fluid, thus improving and accelerating the drying process. However, it has still been difficult and time-consuming to dry and remove reasonably fast, in particular, the last fluid or the last drops adhering to the lowest areas of the substrates.

From JP 8-45883 A2 a substrate carrier with two sidewalls is known, wherein the sidewalls have grooves for receiving the substrates. Within the grooves drainage holes are provided via which the fluid can drain from the grooves. The substrates are not secured at their lower area so that, as with the device described above, fluid may adhere thereat.

JP 7-249604 A2 shows and describes a washing device for substrates positioned in a cassette. The washing liquid is downwardly drained from the washing tank. Measures for removal of remaining liquid from the substrates or from the cassette are not disclosed.

From U.S. Pat. No. 5,370,142 a device is known having in the grooves for receiving the wafers holes through which the treatment fluid during the treatment process in the fluid container can be either removed by suction or introduced in order to remove contaminants from the grooves. This document also does not provide any suggestion in regard to removal of remaining fluid after lifting of the substrates or the substrate carrier.

From JP1-312829 A2 a device for the treatment of semiconductor substrates is known in which an arm is provided that, after lifting of the substrate cassette, wipes across the underside thereof in order to remove adhering drops. The arm however is wet itself and distributes liquid across the entire underside of the cassette so that a considerable amount of residual liquid still adheres to the cassette.

From documents JP 4-317330 A2, JP 60-229339 A2 and JP 6-181196 A2 more devices for the treatment of substrates are known in which however the same disadvantages are observed, i.e., residual liquid still adheres to the substrates or the cassettes after the treatment.

SUMMARY OF THE INVENTION

Based on this, the object of the invention is the development of a device of the aforementioned kind that provides a simple way to treat and, in particular, dry the substrates faster and more reliably.

The object of the invention is inventively solved by providing the receiving device with a fluid suction device having suction openings arranged for removal of the residual fluid, after lifting of the substrates or the substrate carrier from the fluid, at the lowest contact locations of the substrates or the substrate carrier. With this inventive feature it is possible to remove the (liquid) adhering to the lowest locations or edges of the substantially already pre-dried substrates or substrate carrier, so that not only the drying process is accelerated but also adhering of liquid at these locations and thus adhering of contaminants or contamination of other treatment fluids during subsequent treatment steps is prevented.

The fluid suction device is advantageously used after the treatment fluid, for instance, a rinsing agent, has been removed from the substrates and/or the substrate carrier, for instance, by actively lifting the substrates and/or the substrate carrier completely above the fluid surface or, in particular, in the case of the substrate carrier, by draining the treatment fluid from the fluid container.

According to another advantageous embodiment of the invention, the suction openings are connected to a vacuum source. Through the suction openings, that are advantageously embodied as holes, but may also be slots, the last fluid adhering to the substrates, for example, the last fluid drops still adhering to the lowest points of the substrates or the substrate carrier, is sucked. According to an especially advantageous embodiment of the invention, the suction openings are advantageously provided at the lowest points of the substrates and/or the substrate carrier, because the last fluid or drops collect and remain especially there.

Another advantageous embodiment of the invention, is to provide the receiving device with at least one substrate carrier and to arrange the suction openings at locations of the receiving device where the substrate carrier contacts the receiving device. In conjunction with this embodiment, it was found to be especially advantageous to rest the substrate carriers against the raised support areas of the receiving device so that a clearance between the substrate carrier and the suction openings is present. In this manner, a better suction effect is achieved as compared to placing the substrate carrier on the suction openings with its entire contact area or edge. In this context, it is advantageous to position the substrate carrier at pre-defined points, for instance, on two support points centrally arranged in the longitudinal and/or transverse direction on the receiving device, so that at the remaining locations, for example, across the remaining frame areas, the suction openings provided in the receiving device have a clearance to the substrate carrier.

When the receiving devices are embodied or provided for the holding of substrates, it is advantageous to provide suction openings at the contact locations of the receiving device, where the substrates rest. In this context it is advantageous, when the contact locations are the lowest points of the substrates. When lifting the substrates out of the treatment fluid or when draining the treatment fluid, drops remain at these lowest points and have to be removed by suction.

It is advantageous to provide at least one knife-like bridge as a receiving device for the substrates. To avoid repetition concerning this embodiment, reference is made to the German patent application 196 37 875.3 of the same applicant, which has not been published as of the filing date of this application.

According to another very advantageous embodiment of the invention, at least one drop draining element is provided that can be brought in contact with the lowest point of the substrates. To avoid repetition concerning this embodiment also, reference is made to the German patent application 196 40 848.2 of the same applicant disclosing this embodiment, which application has not been published as of the filing date of this application and is incorporated by reference into the present patent application. It is especially advantageous to use a fluid suction device according to this invention in conjunction with such a drop draining element.

As described in detail in the aforementioned patent applications of the same applicant, published and non-published as of the filing date of this application, devices for the treatment of substrates are advantageously provided with a lifting device to lift the substrates and/or at least one substrate carrier out of the treatment fluid. Lifting devices of this kind that lift the substrates and the substrate carrier out of the treatment fluid, advantageously a rinsing agent, by employing a differential stroke and different speeds relative to one another have, in particular, been described in DE 195 46 990.9 or DE 196 37 875.3. In order to provide a flexible connection between the suction openings of the receiving device and the channels provided in the receiving device and connected to the suction openings, the suction openings and the channels are connected to the vacuum source outside the fluid container by a flexible hose. However, as an alternative realization, it is especially advantageous to integrally incorporate the connections between the suction openings and/or the channel, on the one hand, and the vacuum source outside the fluid container, on the other hand, into the support elements of the receiving device, for instance, in the support arms that connect the receiving device to the lifting device. In this manner, a more compact design with reliable fluid removal is achieved.

BRIEF DESCRIPTION OF THE DRAWINGS

Additional features, benefits and details of the invention are disclosed with the aid of the following preferred embodiments with reference to the figures. They show in:

FIG. 1: a schematic cross-section of an inventive embodiment, wherein a substrate carrier is positioned on a receiving device having a fluid suction device, FIG. 2: a schematic cross-section of an inventive device comprising a drop draining element with a fluid suction device.

DESCRIPTION OF PREFERRED EMBODIMENTS

Figure 5:
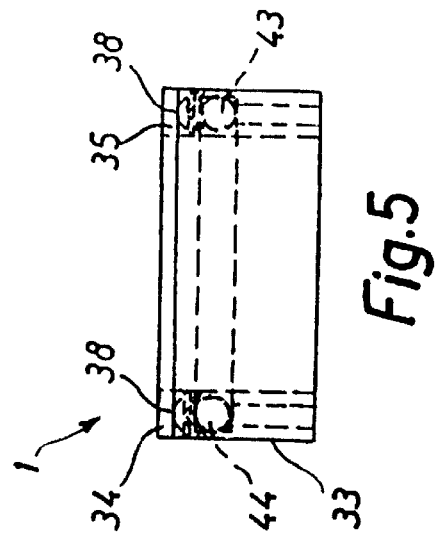

The receiving device 1 according to the invention, shown only schematically in FIG. 1, is comprised of support elements 2, 3 for a substrate carrier 4 that holds substrates 5, in the shown embodiment in the form of disk-shaped semiconductor wafers.

The support elements 2, 3 are provided with suction openings 6, 7 at their converging upper ends that are connected with a non-represented vacuum source by supply lines 8, 9, 10.

Details and embodiments of the receiving device 1 and/or the substrate carrier 4 are described, in particular, in DE 195 46 990.9 and DE 196 37 875.3 and are incorporated by reference into the present patent application to avoid repetition concerning this embodiment.

After the receiving device 1 has been lifted, at least with the upper areas of the support elements 2, 3 that are provided with suction openings 6, 7, above the surface 11 of the treatment fluid, advantageously a rinsing agent, the substrate carrier 4 has already been dried, for instance, by utilizing the Marangoni method. However, in the embodiment of FIG. 1 at the lower areas, for instance on the legs 12, 13 of the substrate carrier 4, treatment fluid remains and accumulates as drops on the lower side of the legs 11, 12. To remove those drops, a vacuum is applied to the suction openings 6, 7 sucking away the remaining drops adhering to these areas. In this manner, a simple and fast drying of the substrate carrier 4 can be achieved even on its critical, lowest areas.

The embodiment shown in FIG. 2 is comprised of rectangular substrates 5, for instance, rectangular masks, that are to be treated or dried. In the schematically shown embodiment, the receiving device 1 is comprised of a first receiving element 22 with receiving areas 22 and 23 and a second receiving element 24 with receiving areas 25 and 26.

A knife-like drop draining element 27 is connected to the second receiving element 24 by arms 28, 29, so that the tip 30 of the knife-like drop draining element 27 is positioned at a constant distance to the second receiving element 24 and touches the lowest corner of the square substrate 5, when the receiving device 1 has been completely lifted above the surface 11 of the treatment fluid. A receiving device of this kind as well as its function has been described in the patent application DE 196 40 848.2 of the applicant of this present patent application, which has not been published as of the filing date of this application. To avoid repetition concerning this embodiment, the disclosure thereof is incorporated by reference into the present patent application.

Just like the receiving elements 2, 3, the drop draining element 27 also comprises suction openings 31 according to the embodiment shown in FIG. 1 that are connected to a vacuum source by a vacuum line 32.

After the entire receiving device has been lifted at least so far above the surface 11 of the treatment fluid that at least the upper area of the drop draining element 27 with the suction openings is positioned above the fluid surface 11, a vacuum is applied, thus removing the drops adhering to the lowest point, i.e., the lower corner of mask 5. In this manner, it is easily possible to remove the drops adhering to the lowest points of the substrates 5, in particular, from the edges and corners, and to dry these areas fast and remove any contaminants.

With the aid of FIGS. 3, 4 and 5, in the following an embodiment of a receiving device 1 is described that is embodied to support one substrate carrier 4.

The receiving device 1 is comprised of a frame 33 with receiving legs 34 through 37 that hold the substrate carrier 4. The frame is provided with a multitude of suction openings 38 that are open on the top and positioned at a small distance to the bottom sides of the legs 12, 13 of the substrate carrier 4.

Figure 4:
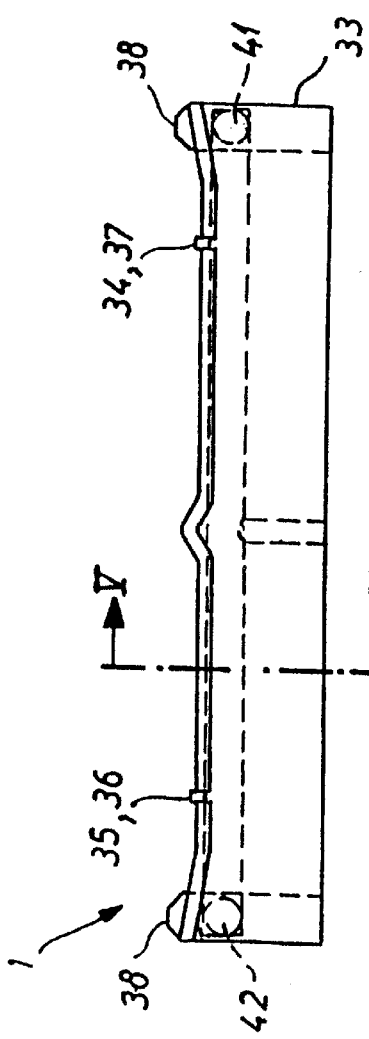
FIG. 4: a cross-section of the receiving device shown in FIG. 3 along section line IV—IV of FIG. 3, and FIG. 5: a cross-section of the receiving device shown in FIG. 3 along section line V—V of FIG. 4.
Figure 3:
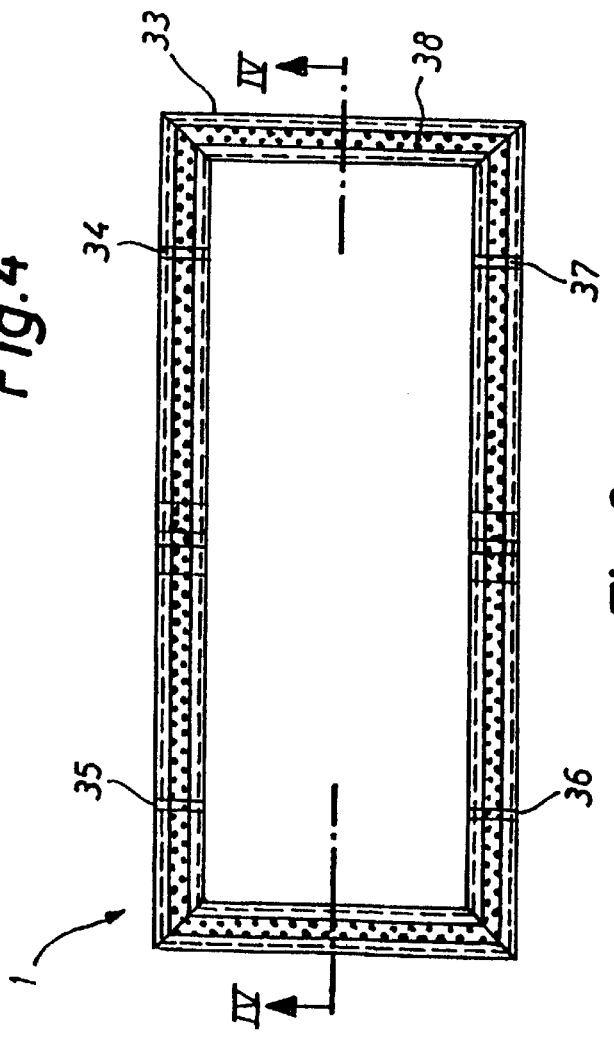
FIG. 3: an embodiment of an inventive receiving device for a substrate carrier in top view.

The receiving device 1 shown in FIG. 3, 4 and 5 is movable in a reciprocating manner with lifting devices that have been described in the aforementioned DE 195 46 990.9 and DE 196 37 875.3 which are incorporated by reference into the present patent application to avoid repetition concerning this embodiment.

The suction openings 38 are connected to suction channels 41 through 44 typically extending along the entire length and width of the frame elements and providing the path for the bleeding of air.

The invention has been disclosed with the aid of preferred embodiments. However, persons skilled in the art may be able to implement various alterations, designs and modifications without departing from the gist of the invention. In particular, the embodiment of the suction openings 38 can be varied according to the respective requirements or specifications. The connection of the channels 41 through 44 to the vacuum source is advantageously comprised of a flexible hose that does not interfere with the movement of the receiving devices 1. According to an alternative advantageous embodiment of this embodiment, it is also possible to connect the channels to the vacuum source outside the container area by the support elements or arms for the receiving device, wherein these support elements and arms are connected to the lifting devices for vertically moving the receiving devices 1 in a reciprocating manner.

The specification incorporates by reference the entire disclosure of German priority documents 196 44 779.8 of Oct. 28, 1996, as well as of International Application PCT/EP97/05054 of Sep. 16, 1997.

The present invention is, of course, in no way restricted to the specific disclosure of the specification and drawings, but also encompasses any modifications within the scope of the appended claims.

What is claimed is:

1. A device for the treatment of substrates (5), said device comprising:
    a container filled with a treatment fluid;
    at least one receiving device (1) for lifting substrates (5) or at least one substrate carrier (4) out of the treatment fluid;
    said receiving device (1) having a fluid suction device with suction openings (6, 7, 31, 38), wherein said suction openings (6, 7, 31, 38) are connected to a vacuum source;
    said suction openings (6, 7, 31, 38) provided for removal of residual fluid from the substrates (5) or the at least one substrate carrier (4) after lifting of the substrates (5) or the substrate carrier (4) from the fluid;
    said suction openings (6, 7, 31, 38) arranged in the vicinity of lower areas of the substrates (5) or the substrate carrier (4), wherein the lower areas are located adjacent to said receiving device (1).

2. A device according to claim 1, wherein said suction openings (6, 7; 31; 38) are holes and/or slots.

3. A device according to claim 1, wherein said at least one receiving device (1) receives at least one of the substrate carriers (4) and wherein said suction openings (6, 7; 38) are positioned at contact locations of said at least one receiving device (1), where the substrate carrier (4) contacts said at least one receiving device (1).

4. A device according to claim 1, wherein said at least one receiving device (1) has raised support areas (34–37) for receiving at least one of the substrate carriers (4), and wherein the substrate carrier (4) contacts said raised support areas (34–37) so that a clearance is present between the substrate carrier (4) and said suction openings (38).

5. A device according to claim 1, wherein said at least one receiving device (1) directly receives the substrates (5), and wherein said suction openings (6, 7, 31, 38) are provided at locations where the substrates contact said at least one, receiving device (1).

6. A device according to claim 5, wherein the substrates (5) have a lowest point and wherein said substrates contact said at least one receiving device (1) with the lowest points.

7. A device according to claim 1, wherein said at least one receiving device (1) is a knife-like bridge receiving the substrates (5).

8. A device according to claim 1, further comprising at least one drop draining element (27) for contacting a lowest point of the substrates (5).

9. A device according to claim 8, wherein said fluid suction device is provided at said drop draining element (27).

10. A device according to claim 1, wherein said suction openings (6, 7; 31; 38) are connected to at least one channel (41–45) provided in said at least one receiving device (1).

11. A device according to claim 10, wherein said suction openings (6, 7; 31; 38) and/or said channels (41 through 45) are connected to the vacuum source by a flexible hose.

12. A device according to claim 10, wherein a connection between the vacuum source and said suction openings (6, 7; 31; 38) and/or said channel (41 through 45) is integrally provided in support elements of said receiving device (1).

13. A device according to claim 1, wherein said at least one receiving device (1) is vertically movable in a reciprocating manner.

* * * * *

UNITED STATES PATENT AND TRADEMARK OFFICE
CERTIFICATE OF CORRECTION

PATENT NO. : 6,164,300
DATED : December 26, 2000
INVENTOR(S) : Dietmar Schönleber and Aurelia Fingerholz It is certified that error appears in the above-identified patent and that said Letters Patent is hereby corrected as shown below:

On the title page, the following items should read as follows:

[54] Title

DEVICE FOR TREATING SUBSTRATES

[30] Foreign Application Priority Data

Oct. 28, 1996 [DE] Germany.........196 44 779

Signed and Sealed this

Fifteenth Day of May, 2001

Attest:

NICHOLAS P. GODICI

*Attesting Officer*    *Acting Director of the United States Patent and Trademark Office*